(12) United States Patent  (10) Patent No.: US 8,267,701 B2
Beaman et al.  (45) Date of Patent: Sep. 18, 2012

(54) ALIGNMENT STRUCTURE HAVING A FRAME STRUCTURE AND BRIDGING CONNECTIONS TO COUPLE AND ALIGN SEGMENTS OF A SOCKET HOUSING

(75) Inventors: Brian S. Beaman, RTP, NC (US); William L. Brodsky, Endicott, NY (US); John L. Colbert, Rochester, MN (US); Mark K. Hoffmeyer, Rochester, MN (US); Yuet-Ying Yu, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 265 days.

(21) Appl. No.: 12/783,451

(22) Filed: May 19, 2010

(65) Prior Publication Data

US 2011/0287638 A1 Nov. 24, 2011

(51) Int. Cl.
H01R 12/00 (2006.01)
(52) U.S. Cl. ......................................................... 439/68
(58) Field of Classification Search .............. 439/68–71, 439/701, 268
See application file for complete search history.

(56) References Cited

U.S. PATENT DOCUMENTS

| | | | |
|---|---|---|---|
| 6,540,527 B1 | 4/2003 | Tamarkin | |
| 6,602,084 B2 * | 8/2003 | Sagano et al. | 439/268 |
| 6,679,707 B1 * | 1/2004 | Brodsky et al. | 439/71 |
| 6,945,788 B2 | 9/2005 | Trout et al. | |
| 7,059,869 B2 | 6/2006 | Wertz et al. | |
| 7,090,507 B2 | 8/2006 | Wertz et al. | |
| 7,101,210 B2 | 9/2006 | Lin et al. | |
| 7,195,493 B1 * | 3/2007 | Polnyi | 439/70 |
| 7,261,572 B2 | 8/2007 | Zheng | |
| 7,517,256 B2 * | 4/2009 | Chang | 439/701 |
| 7,819,669 B2 * | 10/2010 | Liao et al. | 439/66 |
| 7,878,818 B2 * | 2/2011 | Cheng et al. | 439/66 |

(Continued)

FOREIGN PATENT DOCUMENTS

JP 2008027753 A 2/2008

OTHER PUBLICATIONS

Beaman, Benchmark Testing of LGA Sockets for Server Applications, IPACK2007-33067 ASME InterPAC '07, Jul. 2007, pp. 459-467.

(Continued)

*Primary Examiner* — Chandrika Prasad
(74) *Attorney, Agent, or Firm* — Kunzler Needham Massey & Thorpe

(57) ABSTRACT

An apparatus is disclosed for aligning socket housing segments for an area array device. Each socket housing segment includes at least a first surface and a second surface, with the second surface opposite the first surface. The second surface of each socket housing segment provides electrical connections for a portion of the area array device. Socket contact pads are disposed on the first surfaces of the plurality of socket housing segments. The socket contact pads correspond to substrate contact pads disposed on a substrate. One or more alignment structures are disposed at a space between the socket housing segments. Each alignment structure is coupled to at least two of the socket housing segments. The one or more alignment structures maintain a predetermined alignment of each socket housing segment so that the socket contact pads align with the substrate contact pads during a surface mount connection process.

25 Claims, 9 Drawing Sheets

U.S. PATENT DOCUMENTS

2007/0042615 A1  2/2007  Liao
2008/0153322 A1* 6/2008  Liao .............................. 439/68
2008/0239683 A1  10/2008 Brodsky et al.
2008/0242121 A1  10/2008 Browning
2008/0268670 A1  10/2008 Zheng

OTHER PUBLICATIONS

Method for an LGA Package Socket Assembly with a Threaded Socket Cap and Integrated Load Ring, IP.com Prior Art Database Technical Disclosure, Aug. 27, 2003.

Square Shaped Pads for Land Grid Array Packages, IP.com Prior Art Database Technical Disclosure, Feb. 28, 2005.

Method for Low-Resistance LGA and Double-Compression Contacts for Sockets and Power Connectors, IP.com Prior Art Database Technical Disclosure, Jul. 10, 2006.

Method for an LGA Pick-and Place Cover Molded to a Socket Base for Multiple Actuations, IP.com Prior Art Database Technical Disclosure, Feb. 13, 2007.

Method for Partitioned Sockets, IP.com Prior Art Database Technical Disclosure, Feb. 13, 2007.

* cited by examiner

ALIGNMENT STRUCTURE HAVING A FRAME STRUCTURE AND BRIDGING CONNECTIONS TO COUPLE AND ALIGN SEGMENTS OF A SOCKET HOUSING

FIELD

The subject matter disclosed herein relates to area array devices and more particularly relates to sockets for area array devices.

BACKGROUND

Description of the Related Art

An area array device has an array of electrical contacts on a face of the device, instead of having pins or other contacts around a perimeter of the device. An array of contact pads provides far more electrical connections than do contacts around a perimeter. Area array devices also have heat conduction and electrical performance advantages. Area array devices can be electrically connected by using a socket, or by directly soldering the contact pads to form connections.

One such socket that provides electrical connections for some area array devices is a land grid array ("LGA") socket. A hybrid LGA socket has an array of pressure spring contact posts on one side to provide electrical connections for an area array device and has surface mount connections on an opposite side, for direct connection to a substrate.

LGA sockets sometimes provide a large number of electrical connections for an area array device. These LGA sockets are sized large enough to fit each of the electrical connections that they provide. For a hybrid LGA socket, this means that in addition to the contacts for the area array device, there is often a large number of surface mount connections for connection to a substrate. Often solder balls are used for the surface mount connection.

The high temperatures used during reflow soldering can cause a hybrid LGA socket to expand, contract, bend, distort, or warp, leading to misaligned or non-wet connections between the hybrid LGA socket and the substrate. These problems can increase with larger hybrid LGA sockets, as the higher surface areas between the sockets and the substrate make it more difficult to maintain sufficient flatness for forming successful electrical connections. Differential expansion and contraction of a hybrid LGA socket due to heating and cooling of the socket during reflow soldering can cause a permanent distortion or warpage of the finished socket assembly, especially for large hybrid LGA sockets.

BRIEF SUMMARY

From the foregoing discussion, it should be apparent that a need exists for an apparatus, system, and method that align socket contacts. Beneficially, such an apparatus, system, and method would maintain alignment of socket contacts during a surface mount connection process.

The present invention has been developed in response to the present state of the art, and in particular, in response to the problems and needs in the art that have not yet been fully solved by currently available area array device socket alignment techniques. Accordingly, the present invention has been developed to provide an apparatus, system, and method for socket contact alignment that overcome many or all of the above-discussed shortcomings in the art.

Four apparatuses to align socket housing segments for an area array device are provided. The first apparatus includes a plurality of elements. These elements in the described embodiments include a plurality of socket housing segments, a plurality of socket contact pads, and one or more alignment structures.

In one embodiment, the socket housing segments are for an area array device. Each socket housing segment includes at least a first surface and a second surface. The second surfaces are opposite the first surfaces. The second surface of each socket housing segment, in one embodiment, provides electrical connections for a portion of the area array device. In one embodiment, the socket contact pads are disposed on the first surfaces of the plurality of socket housing segments. The socket contact pads, in one embodiment, correspond to substrate contact pads disposed on a substrate. The socket housing segments, in one embodiment, form a hybrid land grid array ("LGA") socket for electrically coupling the area array device to the substrate.

In one embodiment, the one or more alignment structures are disposed at a space between the socket housing segments. Each alignment structure, in one embodiment, is coupled to at least two of the socket housing segments. The one or more alignment structures maintain a predetermined alignment of each socket housing segment so that the socket contact pads align with the substrate contact pads during a surface mount connection process. The surface mount connection process, in one embodiment, connects the socket contact pads to the substrate contact pads.

The second apparatus also includes a plurality of elements. These elements in the described embodiments include a plurality of socket housing segments, a plurality of socket contact pads, and one or more bridging connections.

In one embodiment, the socket housing segments are for an area array device. Each socket housing segment includes at least a first surface and a second surface. The second surfaces are opposite the first surfaces. The second surface of each socket housing segment, in one embodiment, provides electrical connections for a portion of the area array device. In one embodiment, the socket contact pads are disposed on the first surfaces of the plurality of socket housing segments. The socket contact pads, in one embodiment, correspond to substrate contact pads disposed on a substrate. The socket housing segments, in one embodiment, form a hybrid land grid array ("LGA") socket for electrically coupling the area array device to the substrate.

In one embodiment, the one or more bridging connections are disposed at a space between the socket housing segments. Each bridging connection, in one embodiment, is coupled to at least two of the socket housing segments. Each bridging connection, in a further embodiment, spans the space between the socket housing segments to connect the at least two socket housing segments. The one or more bridging connections maintain a predetermined alignment of each socket housing segment so that the socket contact pads align with the substrate contact pads during a surface mount connection process. The surface mount connection process, in one embodiment, connects the socket contact pads to the substrate contact pads.

The third apparatus also includes a plurality of elements. These elements in the described embodiments include a plurality of socket housing segments, a plurality of socket contact pads, and a frame structure.

In one embodiment, the socket housing segments are for an area array device. Each socket housing segment includes at least a first surface and a second surface. The second surfaces are opposite the first surfaces. The second surface of each socket housing segment, in one embodiment, provides electrical connections for a portion of the area array device. In one embodiment, the socket contact pads are disposed on the first surfaces of the plurality of socket housing segments. The socket contact pads, in one embodiment, correspond to substrate contact pads disposed on a substrate. The socket housing segments, in one embodiment, form a hybrid land grid array ("LGA") socket for electrically coupling the area array device to the substrate.

In one embodiment, the frame structure is disposed at a space between the socket housing segments. The frame structure, in a further embodiment, is disposed along one or more edges of the socket housing segments. In one embodiment, the frame structure is coupled to at least two of the socket housing segments. The frame structure maintains a predetermined alignment of each socket housing segment so that the socket contact pads align with the substrate contact pads during a surface mount connection process. The surface mount connection process, in one embodiment, connects the socket contact pads to the substrate contact pads.

The fourth apparatus also includes a plurality of elements. These elements in the described embodiments include a plurality of socket housing segments, a plurality of socket contact pads, a plurality of socket contact posts, one or more bridging connections, and a frame structure.

In one embodiment, the socket housing segments are for an area array device. Each socket housing segment includes at least a first surface and a second surface. The second surfaces are opposite the first surfaces. The second surface of each socket housing segment, in one embodiment, provides electrical connections for a portion of the area array device. In one embodiment, the socket contact pads are disposed on the first surfaces of the plurality of socket housing segments. The socket housing segments, in one embodiment, form a hybrid land grid array ("LGA") socket for electrically coupling the area array device to a substrate.

The socket contact pads, in one embodiment, correspond to substrate contact pads disposed on the substrate. The socket contact posts, in one embodiment, extend from the second surfaces of the socket housing segments. In one embodiment, the socket contact posts correspond to area array contact pads disposed on the area array device.

In one embodiment, the one or more bridging connections span a space between the socket housing segments to connect at least two of the socket housing segments. The one or more bridging connections, in a further embodiment, are formed of the same material as the socket housing segments. In another embodiment, the one or more bridging connections are formed in the same shot of a multi-shot injection molding process as the socket housing segments.

In one embodiment, the frame structure is disposed along one or more edges of the socket housing segments. In a further embodiment, the frame structure substantially fills an area of the space between the housing segments that is not occupied by the one or more bridging connections. The frame structure, in another embodiment, substantially circumscribes an outer perimeter of the socket housing segments. In one embodiment, the frame structure is formed of a different material than the socket housing segments during a different shot of the multi-shot injection molding process. The different material, in one embodiment, substantially matches the coefficient of thermal expansion of the substrate.

The one or more bridging connections and the frame structure, in one embodiment, are each coupled to at least two of the socket housing segments. The one or more bridging connections and the frame structure maintain a predetermined alignment of each socket housing segment so that the socket contact pads align with the substrate contact pads during a reflow solder process. The reflow solder process, in one embodiment, solders the socket contact pads to the substrate contact pads.

References throughout this specification to features, advantages, or similar language do not imply that all of the features and advantages may be realized in any single embodiment. Rather, language referring to the features and advantages is understood to mean that a specific feature, advantage, or characteristic is included in at least one embodiment. Thus, discussion of the features and advantages, and similar language, throughout this specification may, but do not necessarily, refer to the same embodiment.

Furthermore, the described features, advantages, and characteristics of the embodiments may be combined in any suitable manner. One skilled in the relevant art will recognize that the embodiments may be practiced without one or more of the specific features or advantages of a particular embodiment. In other instances, additional features and advantages may be recognized in certain embodiments that may not be present in all embodiments.

These features and advantages of the embodiments will become more fully apparent from the following description and appended claims, or may be learned by the practice of embodiments as set forth hereinafter.

BRIEF DESCRIPTION OF THE DRAWINGS

In order that the advantages of the embodiments of the invention will be readily understood, a more particular description of the embodiments briefly described above will be rendered by reference to specific embodiments that are illustrated in the appended drawings. Understanding that these drawings depict only some embodiments and are not therefore to be considered to be limiting of scope, the embodiments will be described and explained with additional specificity and detail through the use of the accompanying drawings, in which.

DETAILED DESCRIPTION

Figure 1A:
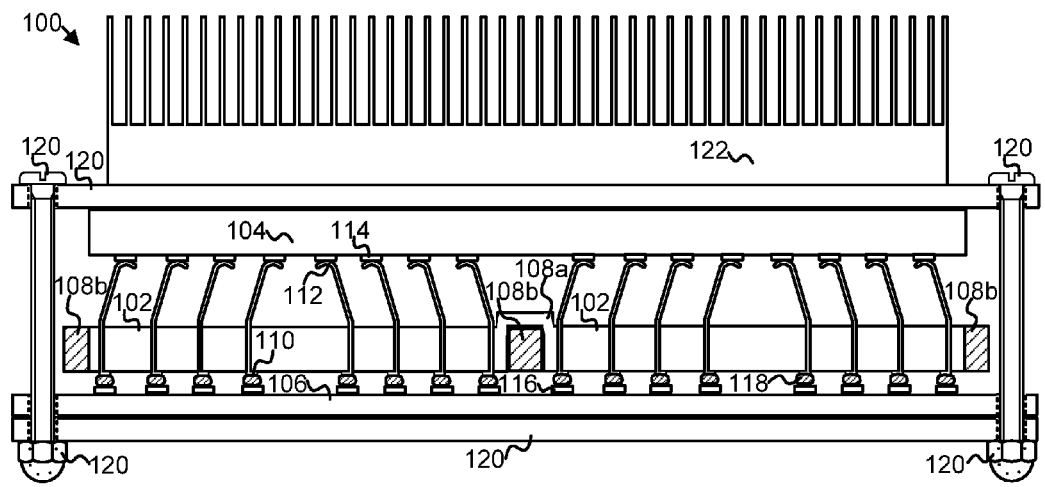
FIG. 1A is a schematic block diagram illustrating one embodiment of a system to align socket housing segments for an area array device in accordance with the present invention.

Reference throughout this specification to "one embodiment," "an embodiment," or similar language means that a particular feature, structure, or characteristic described in connection with the embodiment is included in at least one embodiment. Thus, appearances of the phrases "in one embodiment," "in an embodiment," and similar language throughout this specification may, but do not necessarily, all refer to the same embodiment, but mean "one or more but not all embodiments" unless expressly specified otherwise. The terms "including," "comprising," "having," and variations thereof mean "including but not limited to," unless expressly specified otherwise. An enumerated listing of items does not imply that any or all of the items are mutually exclusive, unless expressly specified otherwise. The terms "a," "an," and "the" also refer to "one or more" unless expressly specified otherwise.

Furthermore, the described features, structures, or characteristics of the embodiments of the invention may be combined in any suitable manner. In the following description, numerous specific details are provided to provide a thorough understanding of embodiments. One skilled in the relevant art will recognize, however, that embodiments may be practiced without one or more of the specific details, or with other methods, components, materials, and so forth. In other instances, well-known structures, materials, or operations are not shown or described in detail to avoid obscuring aspects of an embodiment.

The schematic flowchart diagrams and/or schematic block diagrams in the Figures illustrate the architecture, functionality, and operation of possible implementations of apparatuses, systems, and methods according to various embodiments of the present invention. It should also be noted that, in some alternative implementations, the functions noted in the block may occur out of the order noted in the Figures. For example, two blocks shown in succession may, in fact, be executed substantially concurrently, or the blocks may sometimes be executed in the reverse order, depending upon the functionality involved. Other steps and methods may be conceived that are equivalent in function, logic, or effect to one or more blocks, or portions thereof, of the illustrated Figures.

Although various arrow types and line types may be employed in the flowchart and/or block diagrams, they are understood not to limit the scope of the corresponding embodiments. Indeed, some arrows or other connectors may be used to indicate only the logical flow of the depicted embodiment. For instance, an arrow may indicate a waiting or monitoring period of unspecified duration between enumerated steps of the depicted embodiment. It will also be noted that each block of the block diagrams and/or flowchart diagrams, and combinations of blocks in the block diagrams and/or flowchart diagrams, can be implemented by special purpose hardware-based systems that perform the specified functions or acts, or combinations of special purpose hardware and computer readable program code.

Figure 1B:
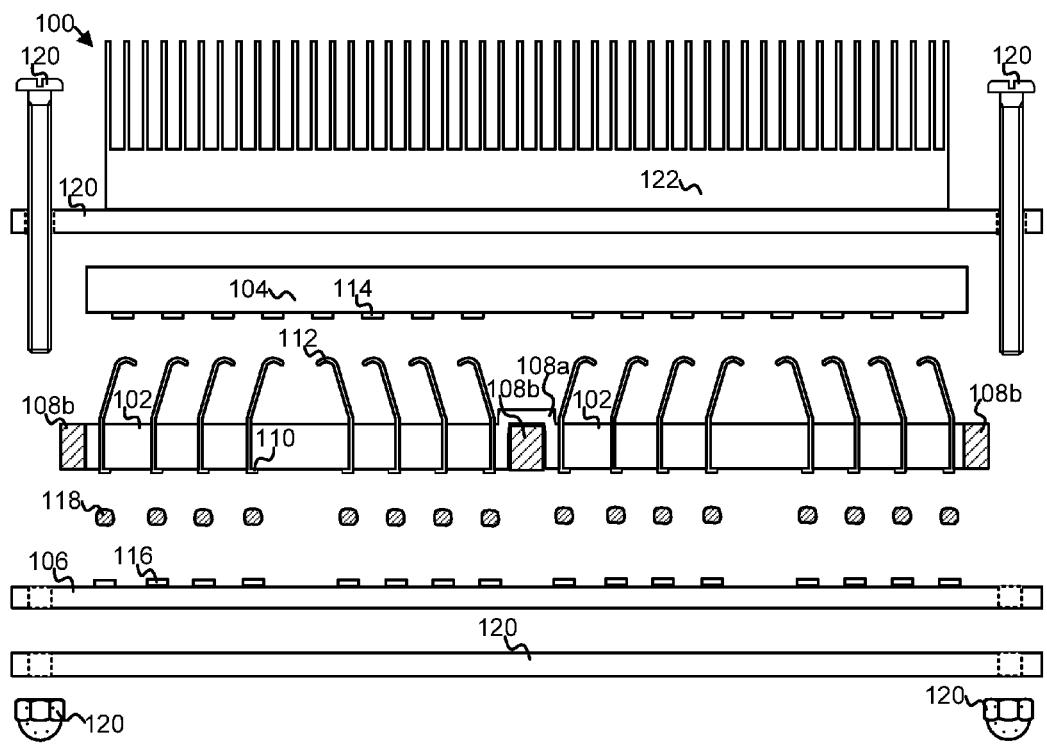
FIG. 1B is a schematic block diagram illustrating another embodiment of a system to align socket housing segments for an area array device in accordance with the present invention.

FIG. 1A depicts one embodiment of a system 100 to align socket housing segments 102 for an area array device 104. FIG. 1B is an exploded view of the system 100 depicted in FIG. 1A. In the depicted embodiment, the system 100 includes several socket housing segments 102, an area array device 104, a substrate 106, one or more alignment structures 108, a group of socket contact pads 110, a group of socket contact posts 112, a group of area array contact pads 114, a group of substrate contact pads 116, substrate connecting material 118, a press device 120, and a heat dissipation device 122. The system 100, in the depicted embodiment, uses the alignment structures 108 to align the socket housing segments 102 with the group of substrate contact pads 116 during a surface mount connection process, for example during reflow soldering of the socket housing segments 102 to the substrate 106.

In the depicted embodiment, the socket housing segments 102 are each separate pieces of a socket housing for the area array device 104. Together, the socket housing segments 102 form a socket housing that provides electrical connections between the area array device 104 and the substrate 106. The socket housing segments 102, in a further embodiment, may provide electrical connections from the area array device 104 and/or the substrate 106 to other electrical devices. The socket housing segments 102, in one embodiment, are formed of a durable, insulating material, such as a plastic, ceramic, or the like. In a further embodiment, the socket housing segments 102 may include multiple layers of materials, such as electrically conductive layers, insulating layers, structural support layers, stiffening layers, heat dissipation layers, and the like. In another embodiment, the socket housing segments 102 are formed of a plastic or other polymer material using an injection molding process.

In the depicted embodiment, the socket housing segments 102 form a hybrid land grid array ("LGA") socket. The socket housing segments 102, in the depicted embodiment, have a first surface with the socket contact pads 110 that are electrically coupled to the substrate contact pads 116. The socket housing segments 102, in the depicted embodiment, have a second surface opposite the first surface with the socket contact posts 112 that provide electrical connections for the group of area array contact pads 114 on the area array device 104. In the depicted embodiment, the socket housing segments 102 are surface mounted directly onto the substrate 106 with the connecting material 118 and the array of socket contact posts 112 form pressure spring connections with the area array device 104.

While rows of sixteen area array contact pads 114, socket contact posts 112, socket contact pads 110, and substrate contact pads 116 are depicted in the cross-sectional views of FIGS. 1A and 1B for clarity, in further embodiments, other numbers may be used. For example, in one embodiment, the system 100 may include large arrays of hundreds or thousands of area array contact pads 114, socket contact posts 112, socket contact pads 110, and substrate contact pads 116, or the like. One of skill in the art, in view of this disclosure, will recognize other patterns, numbers, and arrangements of area array contact pads 114, socket contact posts 112, socket contact pads 110, and substrate contact pads 116 that may be used.

In the depicted embodiment, each of the socket housing segments 102 are separated by a gap or space between the socket housing segments 102. The socket housing segments 102, in the depicted embodiment, are coupled to each other by the alignment structures 108 and by connection to the substrate 106, and are otherwise separate, independent segments. Separating the socket housing segments 102 by a gap or space and aligning the separate socket housing segments 102 with the alignment structures 108, in one embodiment, maintains a predetermined alignment of the socket housing segments 102 to align the socket contact pads 110 with the substrate contact pads 116 during a surface mount connection process.

In the depicted embodiment, the socket contact pads 110 are disposed on the first surfaces of each of the socket housing segments 102, facing the substrate 106. The socket contact pads 110 are electrically conductive, and may be formed of one or more electrically conductive materials such as copper, gold, nickel, and/or another electrically conductive material. The socket contact pads 110 may include an alloy, may be plated, or may be otherwise finished or treated to facilitate electrical connections, prevent corrosion, and the like.

In the depicted embodiment, the socket contact pads 110 provide electrical connections for corresponding substrate contact pads 116. In the depicted embodiment, the socket contact pads 110 are electrically and mechanically coupled to the substrate contact pads 116 by the connecting material 118, which forms a surface mount connection between the socket housing segments 102 and the substrate 106. For example, in various embodiments, the connecting material 118 may include solder, electrochemical plating, and/or another connecting material capable of electrically and mechanically coupling the socket contact pads 110 to the substrate contact pads 116.

The socket contact pads 110, in one embodiment, form a pattern corresponding to a pattern of the substrate contact pads 116. In one embodiment, there is a one-to-one ratio between the socket contact pads 110 and the substrate contact pads 116. In a further embodiment, the group of socket contact pads 110 may include one or more extraneous socket contact pads 110 that do not correspond to a substrate contact pad 116. In another embodiment, the substrate 106 may include one or more extraneous substrate contact pads 116 that do not correspond to a socket contact pad 110. For example, in one embodiment, the substrate 106 may include extraneous substrate contact pads 116 for compatibility with more than one type of socket housing segment 102 and/or area array device 104 or the like. As described in greater detail below, the area array device 104 may include an integrated circuit device, a chip carrier, a circuit board, or the like with an area array of contacts on one side of the area array device 104.

In one embodiment, surface and material characteristics of the first surface of the socket housing segments 102 affect the alignment of the socket contact pads 110 during a surface mount connection process connecting the socket contact pads 110 to the substrate contact pads 116. The socket housing segments 102, in one embodiment, are formed of a plastic or other polymeric material, and the surface mount connection process may change one or more surface characteristics of the first surface of the socket housing segments 102.

For example, in one embodiment, flatness characteristics of the first surface of the socket housing segments 102 affect the ability of the connecting material 118 to wet to both the socket contact pads 110 and the substrate contact pads 116 to complete an electrical connection between them during a surface mount connection process such as reflow soldering or the like. In another example, in one embodiment, the coefficient of thermal expansion of the socket housing segments 102 may affect the ability of the connecting material 118 to wet to both the socket contact pads 110 and the substrate contact pads 116 during a surface mount connection process due to expansion of the socket housing segments 102 or the like. In one embodiment, the alignment structures 108 maintain a predetermined alignment of the socket contact pads 110 with the substrate contact pads 116 during a surface mount connection process.

In the depicted embodiment, the socket contact posts 112 extend from the second surfaces of each of the socket housing segments 102, facing the area array device 104. The socket contact posts 112 are electrically conductive, and may be formed of one or more electrically conductive materials such as copper, gold, nickel, and/or another electrically conductive material. The socket contact posts 112 may include an alloy, may be plated, or may be otherwise finished or treated to facilitate electrical connections, prevent corrosion, and the like. In one embodiment, the socket contact posts 112 are formed of the same material as the socket contact pads 110. In a further embodiment, the socket contact posts 112 may be integrally connected with the socket contact pads 110 and formed of a continuous piece of material.

The socket contact posts 112, in the depicted embodiment, provide electrical connections for corresponding area array contact pads 114. In the depicted embodiment, the socket contact posts 112 are electrically coupled to the area array contact pads 114 by the spring pressure between the socket contact posts 112 and the area array contact pads 114. In one embodiment the press device 120 presses the area array device 104 toward the socket housing segments 102 to compress the socket contact posts 112 against the area array contact pads 114, forming an electrical connection between the socket contact posts 112 against the area array contact pads 114.

The socket contact posts 112, in one embodiment, form a pattern corresponding to a pattern of the area array contact pads 114. In one embodiment, there is a one-to-one ratio between the socket contact posts 112 and the area array contact pads 114. In a further embodiment, the group of socket contact posts 112 may include one or more extraneous socket contact posts 112 that do not correspond to an area array contact pad 114. In another embodiment, the area array device 104 may include one or more extraneous area array contact pads 114 that do not correspond to a socket contact post 112. For example, in one embodiment, the group of socket contact posts 112 may include extraneous socket contact posts 112 for compatibility with more than one type of area array device 104 or the like.

In a further embodiment, the second surfaces of the socket housing segments 102 may include one or more alignment and/or fastening features that receive and/or align the area array device 104 relative to the socket contact posts 112. The second surfaces of the socket housing segments 102, in another embodiment, may be positioned to prevent the socket contact posts 112 from contacting each other as the socket contact posts 112 compress toward the socket housing segments 102.

In the depicted embodiment, each socket contact post 112 is integrated with an opposite socket contact pad 110, providing a direct one-to-one pass-through electrical connection between the area array contact pads 114 and the substrate contact pads 116. In a further embodiment, the socket housing segments 102 may include one or more internal electrical connections that re-route electrical connections between socket contact posts 112 and socket contact pads 110. An internal electrical connection within the socket housing segments 102 may electrically connect a socket contact pad 110 and a socket contact post 112 that are not aligned, may electrically connect a socket contact pad 110 and/or a socket contact post 112 with one or more electrical components, or the like.

In the depicted embodiment, the socket contact posts 112 are each compressible contact posts or pins formed into cantilever beams. In a further embodiment, the socket contact posts 112 may include one or more other types of spring contacts, such as C springs, fuzz buttons, radial springs, contact pads, and/or another type of electrically conductive spring contact. Contact with the area array contact pads 114, in the depicted embodiment, compresses the group of socket contact posts 112 toward the socket housing segments 102, forming electrical connections between the area array contact pads 114 and the socket contact posts 112. In one embodiment the compression force is provided by the press device 120.

In the depicted embodiment, the socket contact posts 112 are integrally connected with the socket contact pads 110 and are formed of a continuous piece of material. For example, in one embodiment, a socket contact post 112 and a corresponding socket contact pad 110 may be stamped from a single sheet of electrically conductive material, formed from a single electrically conductive wire, or the like. In a further embodiment, the socket contact posts 112 and corresponding socket contact pads 110 may be constructed of separate materials that are electrically coupled. For example, the socket contact posts 112 and corresponding socket contact pads 110 may be electrically coupled by internal electrical connections within the socket housing segments 102, through contact with a conductor, by welding, by soldering, through electrical connectors, or the like.

In one embodiment, the socket housing segments 102 have several through holes. In a further embodiment, the socket contact pads 110 extend from openings of the holes on the first side of the socket housing segments 102 and the socket contact posts 112 extend from opposite openings of the holes on the second side of the socket housing segments 102. In one embodiment, a conductor extends through the hole between a socket contact pad 110 and a socket contact post 112 to electrically couple the socket contact pad 110 and the socket contact post 112. In one embodiment, the socket contact posts 112 and/or the socket contact pads 110 may be inserted into the socket housing segments 102 using a staking or stitching process.

In one embodiment, the area array device 104 includes an integrated circuit device, a chip carrier, a circuit board, or the like with the area array contact pads 114 forming an area array on one side of the area array device 104. For example, in one embodiment, the area array device 104 may include an LGA device such as a processor or the like. The area array device 104 may include an integrated circuit itself, an integrated circuit mounted on a substrate, a circuit board, a circuit board with one or more electrical components, and/or another device with an area array of area array contact pads 114. The area array contact pads 114 on the area array device 104 are electrically conductive, and may be formed of one or more materials such as copper, gold, nickel, and the like. The area array contact pads 114 may include an alloy, may be plated, or may be otherwise finished or treated to facilitate electrical connections, prevent corrosion, and the like. In one embodiment, the area array contact pads 114 are plated with gold, a gold alloy, or the like. In one embodiment, the area array contact pads 114 are plated onto the area array device 104 using a plating process.

In the depicted embodiment, the press device 120 clamps the area array device 104 and the socket housing segments 102 together. The press device 120 forces the area array contact pads 114 into contact with the socket contact posts 112, compressing the socket contact posts 112 toward the socket housing segments 102 to form electrical connections with the area array contact pads 114. The press device 120 may include one or more clamping plates, clamping levers, fasteners, hinges, connectors, and the like to provide the clamping force.

In the depicted embodiment, the heat dissipation device 122 is integrated with the press device 120. The heat dissipation device 122 transfers heat away from the area array device 104. The heat dissipation device 122, in the depicted embodiment, includes a heat sink device. In other embodiments, the heat dissipation device 122 may include a fan, a blower, a liquid cooling device, and/or other heat dissipation devices.

In the depicted embodiment, the substrate 106 is a planar element that provides structural support and electrical connections to the area array device 104. The substrate 106, in one embodiment, may include multiple layers, such as electrically conductive layers, insulating layers, structural support layers, stiffening layers, heat dissipation layers, and the like. In one embodiment, the substrate 106 is a printed circuit board that may include one or more copper sheets laminated onto a non-conductive dielectric substrate using epoxy resin or the like.

The substrate contact pads 116 on the substrate 106 are electrically conductive, and may be formed of one or more materials such as copper, gold, nickel, and the like. The substrate contact pads 116 may include an alloy, may be plated, or may be otherwise finished or treated to facilitate electrical connections, prevent corrosion, and the like. In one embodiment, the substrate contact pads 116 are plated onto the substrate 106 using a plating process.

In the depicted embodiment, the substrate connecting material 118 electrically and mechanically couples the substrate contact pads 116 to the socket contact pads 110. In one embodiment, the substrate connecting material 118 comprises a lead-tin solder such as a eutectic or other lead-tin solder, a lead-free solder, or other type of solder capable of providing an electrical and structural connection. In another embodiment, the connecting material 118 may include a non-solder electrical coupling material, such as electrochemical plating or the like.

In one embodiment, the connecting material 118, prior to a surface mount connection process, may be initially disposed on the socket contact pads 110, the substrate contact pads 116, or both. For example, in one embodiment, the connecting material 118 includes a ball grid array ("BGA") of solder balls disposed on the socket contact pads 110 and/or the substrate contact pads 116. In response to melting during a reflow solder process or in response to another surface mount connection process, in one embodiment, the connecting material 118 electrically and mechanically couples the socket contact pads 110 to the substrate contact pads 116. In one embodiment, the one or more alignment structures 108 maintain a predetermined alignment of the socket housing segments 102 during the reflow solder process or other surface mount connection process.

In the depicted embodiment, the one or more alignment structures 108 are disposed at a space or gap between the socket housing segments 102. Each of the alignment structures 108, in one embodiment, is mechanically coupled to at least two of the socket housing segments 102. The alignment structures 108 maintain a predetermined alignment of the socket housing segments 102 to align the socket contact pads 110 with the substrate contact pads 116. In one embodiment, the alignment structures 108 maintain the predetermined alignment during a surface mount connection process that connects the socket contact pads 110 to the substrate contact pads 116, such as a reflow solder process, an electrochemical plating process, a welding process, or the like.

In one embodiment, the surface mount connection process heats the connecting material 118 and may also heat other elements of the system 100, such as the substrate 106 and the socket housing segments 102. The surface mount connection process may heat the connecting material 118 in a furnace, such as a belt furnace, a vacuum furnace, a box furnace, or the like, using conduction, convection, infrared, or other heating. In a further embodiment, the surface mount connection process may include further processing, such as quality checks for non-wet connections, flux cleaning, under-filling, connection to additional devices and/or components, and the like.

The predetermined alignment, in one embodiment, is an alignment that matches and aligns the socket contact pads 110 with the substrate contact pads 116. The one or more alignment structures 108, in one embodiment, may maintain the predetermined alignment by supporting the socket housing segments 102 in aligned positions according to the predetermined alignment. In a further embodiment, the one or more alignment structures 108 may maintain the predetermined alignment by allowing flexible movement of the socket housing segments 102 into the predetermined alignment. In the depicted embodiment, the one or more alignment structures 108 include one or more bridging connections 108a and a frame structure 108b.

In one embodiment, the one or more alignment structures 108 substantially fill the space between the socket housing segments 102. In a further embodiment, the one or more alignment structures 108 substantially circumscribe an outer perimeter of the socket housing segments 102. In the depicted embodiment, the frame structure 108b both fills the space between the socket housing segments 102 and circumscribes an outer perimeter of the socket housing segments 102 to substantially circumscribe each of the socket housing segments 102 individually.

In one embodiment, at least one of the one or more alignment structures 108 is formed of a different material than the socket housing segments 102. For example, in one embodiment, an alignment structure 108, such as the frame structure 108b, may be formed of a material that has a coefficient of thermal expansion that substantially matches a coefficient of thermal expansion of the substrate 106. In one embodiment, the socket housing segments 102 may be formed of a material that does not match the coefficient of thermal expansion of the substrate 106 and the one or more alignment structures 108 may maintain the predefined alignment in response to the socket housing segments 102 expanding a different amount than the substrate 106 during the surface mount connection process.

In one embodiment, a material of at least one of the alignment structures 108, such as the frame structure 108b, may be selected based on one or more thermal and/or mechanical properties of the material, such as a coefficient of thermal expansion that matches the coefficient of thermal expansion of the substrate 106. A material of the socket housing segments 102, in one embodiment, may be selected based on a malleability of the material. For example, in one embodiment, the socket housing segments 102 may include holes for the socket contact posts 112 and/or the socket contact pads 110, alignment features for the area array device 104, and/or other fine features and a material for the socket housing segments 102 may be selected that has a malleability during an injection molding process or other forming process to provide those fine features. In one embodiment, the one or more bridging connections 108a are integrally formed with the socket housing segments 102 from the same material as the socket housing segments 102.

In one embodiment, the socket housing segments 102 and an alignment structure 108 of a different material than the socket housing segments 102, such as the frame structure 108b, may be formed in different shots of a multi-shot injection molding process. For example, in one embodiment, the socket housing segments 102 and the one or more bridging connections 108a may be formed in one shot of a multi-shot injection molding process and the frame structure 108b may be formed around the socket housing segments 102 in a different shot of the multi-shot injection molding process.

In one embodiment, at least one of the alignment structures 108 is removable from the socket housing segments 102. For example, an alignment structure 108 may maintain the predetermined alignment during the surface mount connection process and may be removable upon completion of the surface mount connection process. In one embodiment, the frame structure 108b is removable from the socket housing segments 102. One embodiment of a removable alignment structure 108 is described in greater detail with regard to FIGS. 7 and 8.

While the one or more alignment structures 108, in the depicted embodiment, include one or more bridging connections 108a and a frame structure 108b, in further embodiments, the one or more alignment structures 108 may include one or more bridging connections 108a without a frame structure 108b, a frame structure 108b without a bridging connection 108a, or the one or more alignment structures 108 may include other types of alignment structures. The one or more bridging connections 108a, in the depicted embodiment, span the space or gap between the socket housing segments 102 to connect at least two socket housing segments 102. In the depicted embodiment, the bridging connection 108a spans the space between the socket housing segments 102 slightly above the socket housing segments 102. In a further embodiment, the bridging connection 108a may extend directly through the space between the socket housing segments 102 to connect the socket housing segments 102.

In one embodiment, the one or more bridging connections 108a allow flexible movement between the socket housing segments 102 to maintain the predetermined alignment of the socket housing segments 102. For example, by allowing flexible movement between the socket housing segments 102, in one embodiment, the one or more bridging connections 108a allow individual socket housing segments 102 to expand, contract, and/or self-align during the surface mount connection process without interfering with the alignment of other socket housing segments 102. For example, the one or more bridging connections 108a may allow a surface tension of the connecting material 118, once melted, to pull an individual socket housing segment 102 into alignment to maintain the predetermined alignment of the socket housing segments 102 such that the socket contact pads 110 align with the substrate contact pads 116. In another embodiment, the one or more bridging connections 108a preliminarily align the socket housing segments 102 prior to the frame structure 108b being formed around the socket housing segments 102.

The frame structure 108b, in one embodiment, is disposed along one or more edges of the socket housing segments 102. In the depicted embodiment, the frame structure 108b substantially fills an area of the space between the socket housing segments 102 that is not occupied by the one or more bridging connections 108a and substantially circumscribes an outer perimeter of the socket housing segments 102. In other embodiments, the frame structure 108b may be disposed along one or more edges of the socket housing segments 102 and not along other edges, or the like.

Figure 2:
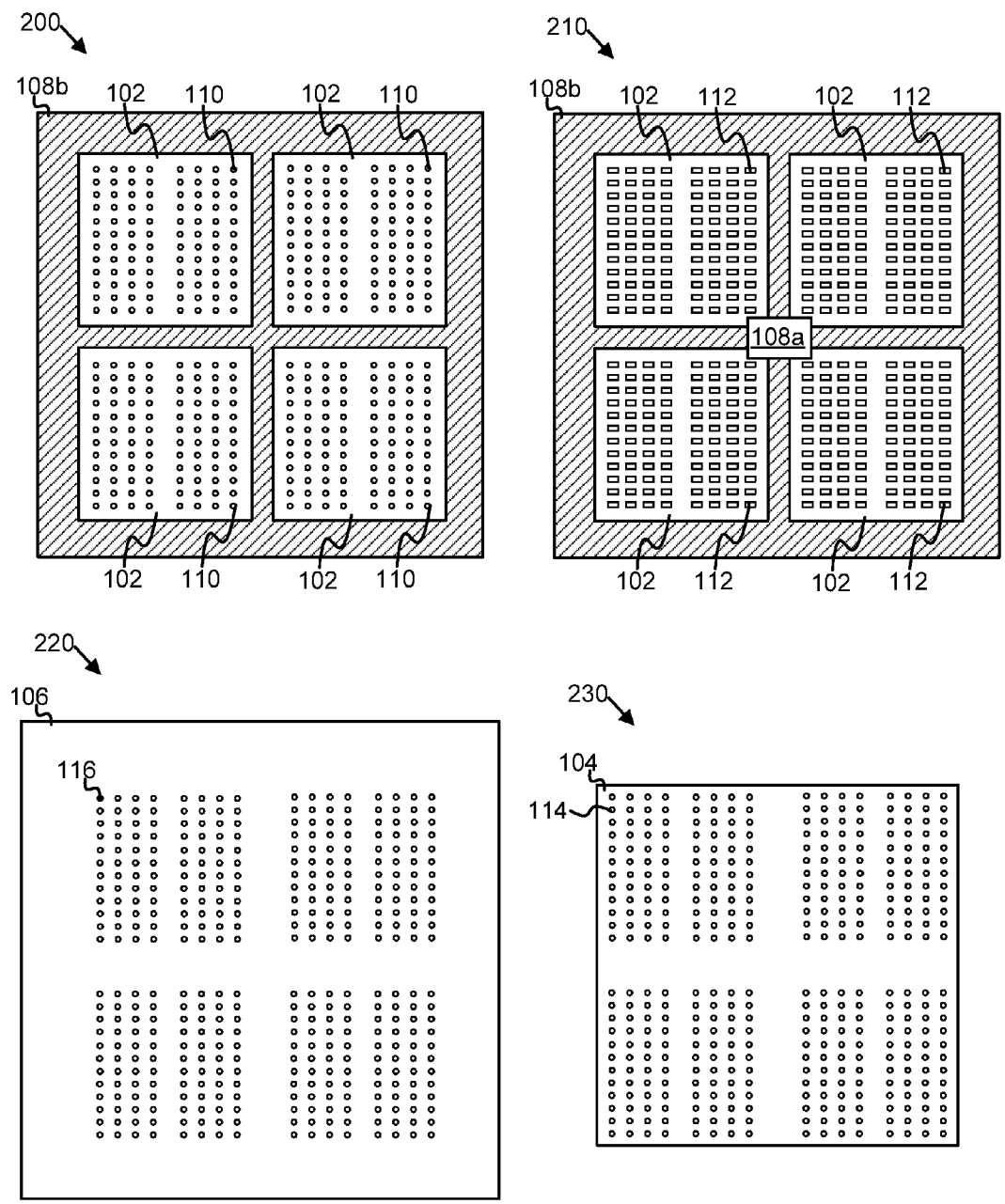
FIG. 2 is a schematic block diagram illustrating embodiments of socket housing segments, alignment structures, an area array device, and a substrate in accordance with the present invention.

FIG. 2 depicts embodiments 200, 210, 220, 230 of the socket housing segments 102, the alignment structures 108, the area array device 104, and the substrate 106. The first embodiment 200 depicts the first side of the socket housing segments 102 with the alignment structures 108. The second embodiment 210 depicts the second side of the socket housing segments 102 with the alignment structures 108. The third embodiment 220 depicts the substrate 106. The fourth embodiment 230 depicts the area array device 104.

In the first embodiment 200, the socket contact pads 110 are disposed on the first side of four socket housing segments 102. Each socket housing segment 102, in the first embodiment 200, includes an eight by twelve array of socket contact pads 110, which together form a sixteen by twenty-four array of socket contact pads 110. The sixteen by twenty-four array of socket contact pads 110 form a pattern that corresponds to the pattern of substrate contact pads 116 on the substrate 106 depicted in the third embodiment 220. The frame structure 108b, in the first embodiment 200, maintains the predetermined alignment of the socket contact pads 110 relative to the substrate contact pads 116.

The second embodiment 210 depicts the second side of the socket housing segments 102, providing an opposite or flipped view of the first embodiment 200. In the second embodiment 210, the socket contact posts 112 are disposed on the second side of the four socket housing segments 102. Each socket housing segment 102, in the second embodiment 210, includes an eight by twelve array of socket contact posts 112, which together form a sixteen by twenty-four array of socket contact posts 112. The sixteen by twenty-four array of socket contact posts 112 form a pattern that corresponds to the pattern of area array contact pads 114 on the area array device 104 depicted in the fourth embodiment 230. The second embodiment 210 includes the frame structure 108b and a bridging connection 108a. In the second embodiment 210, the bridging connection 108a is connected to each of the four depicted socket housing segments 102 and spans the space between the socket housing segments 102 over the bridging connection 108a.

For clarity, the depicted embodiments 200, 210, 220, 230 include sixteen by twenty-four arrays of area array contact pads 114, socket contact posts 112, socket contact pads 110, and substrate contact pads 116. Similarly, for clarity, the depicted embodiments 200, 210, 220, 230 include four socket housing segments 102 each having a similar size and shape. In further embodiments, other numbers, patterns, shapes, and sizes may be used. For example, another embodiment may include large arrays of hundreds or thousands of additional area array contact pads 114, socket contact posts 112, socket contact pads 110, and substrate contact pads 116, or the like. A further embodiment may include a different number of socket housing segments 102 that may have different shapes and sizes. One of skill in the art, in view of this disclosure, will recognize other patterns, numbers, shapes, sizes and arrangements of area array contact pads 114, socket contact posts 112, socket contact pads 110, substrate contact pads 116, and socket housing segments 102 that may be used.

Figure 3:
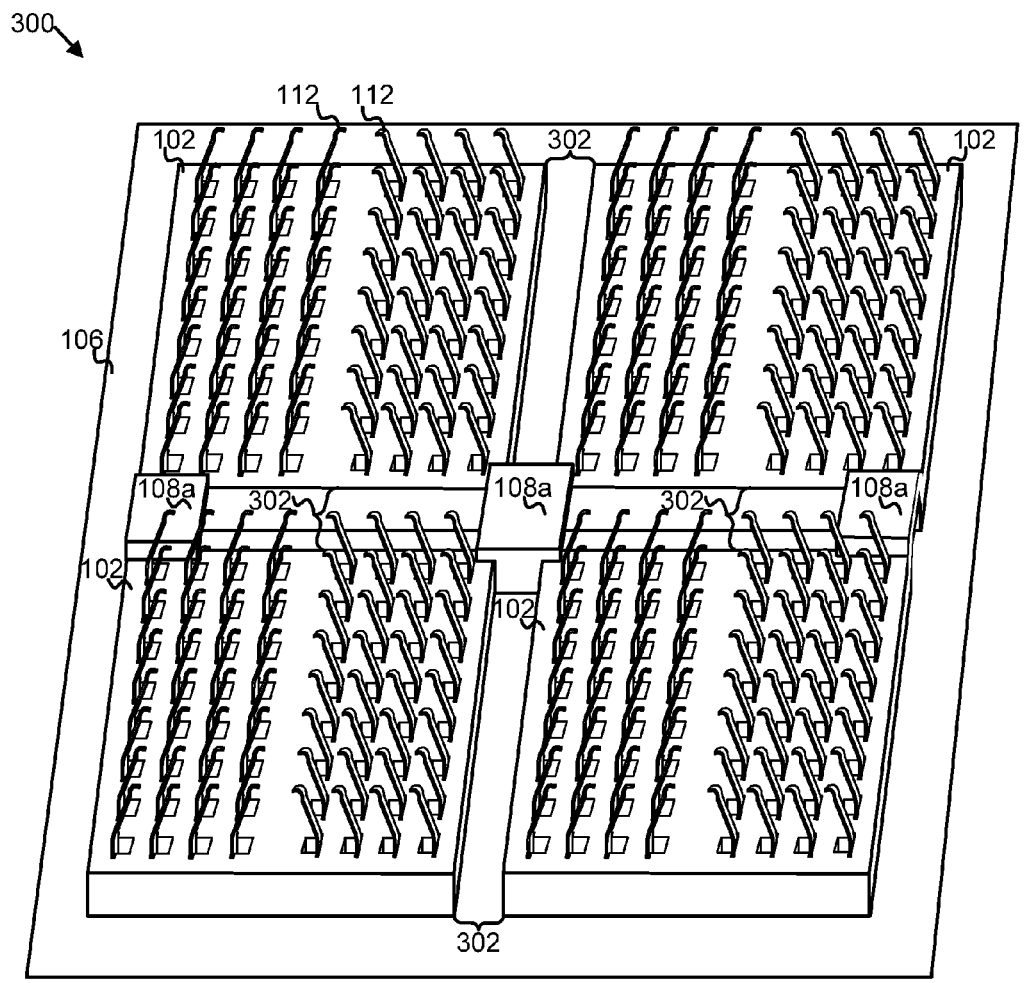
FIG. 3 is a schematic block diagram illustrating another embodiment of a system to align socket housing segments for an area array device in accordance with the present invention.

FIG. 3 depicts another embodiment of a system 300 to align the socket housing segments 102 for the area array device 104. In the depicted embodiment, the system 300 includes the socket housing segments 102, the substrate 106, the bridging connections 108a, and the group of socket contact posts 112. The depicted embodiment further includes the space 302 between the socket housing segments 102.

Figure 4:
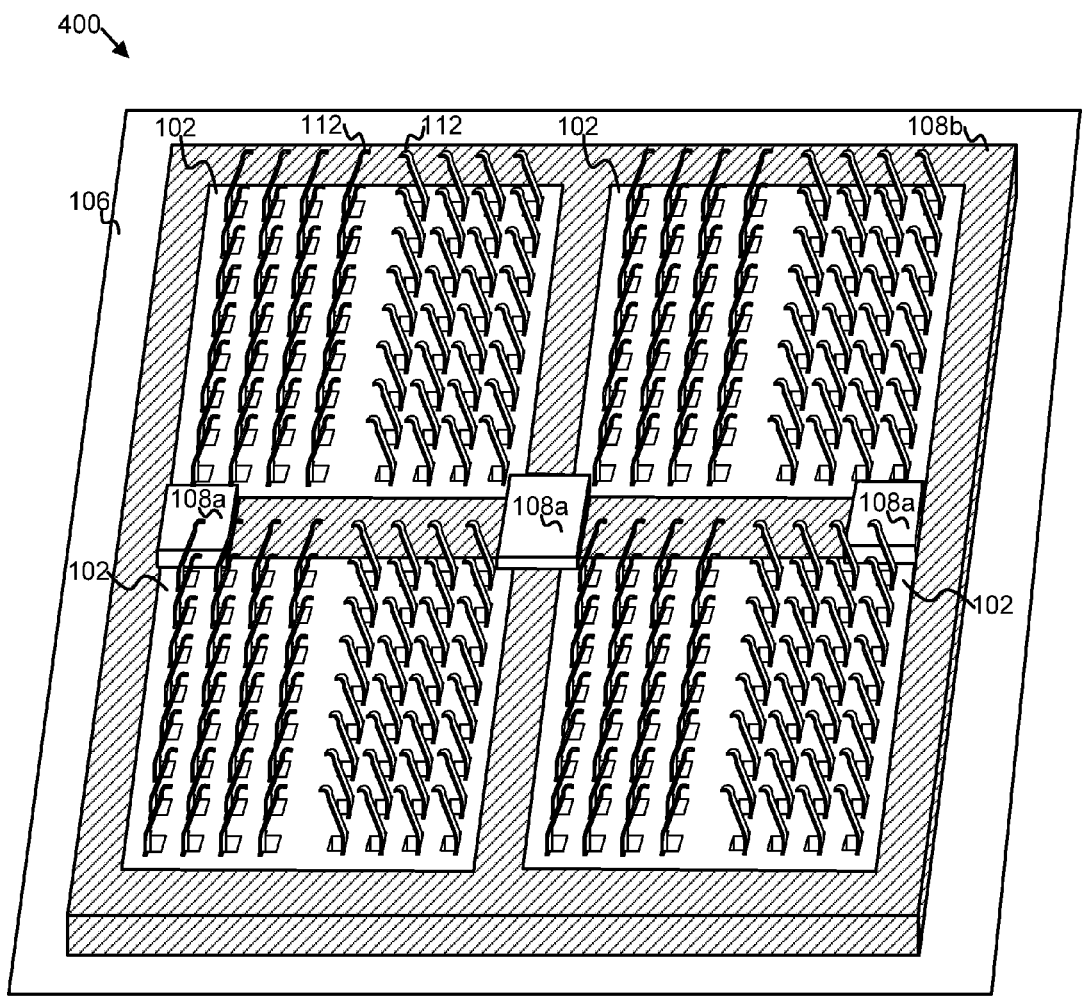
FIG. 4 is a schematic block diagram illustrating a further embodiment of a system to align socket housing segments for an area array device in accordance with the present invention.

In the depicted embodiment, the system 300 includes one or more bridging connections 108a and does not include a frame structure 108b. An embodiment with one or more bridging connections 108a and a frame structure 108b is depicted in FIG. 4. The one or more bridging connections 108a, in the depicted embodiment, include two peripheral bridging connections 108a that each connects two of the socket housing segments 102 and one central bridging connection 108a that connects four of the socket housing segments 102.

In a further embodiment, the system 400 may include a central bridging connection 108a without peripheral bridging connections 108a. The system 400, in another embodiment, may include additional peripheral bridging connections 108a so that there is a peripheral bridging connection 108a between each adjacent socket housing segment 102. The system 400, in one embodiment, may include peripheral bridging connections 108a between each adjacent socket housing segment 102 and may not include a central bridging connection 108a.

In the depicted embodiment, the peripheral bridging connections 108a extend over the space 302 between the socket housing segments 102 to span the space. The central bridging connection 108a extends over the space 302 between the socket housing segments 102 in one direction and further extends through the space 302 between the socket housing segments 102 in another direction. In one embodiment, the bridging connections 108a are formed to fit over a frame structure 108b without interfering with the frame structure 108b.

In one embodiment, the one or more socket housing segments 102 are formed with the space 302 between the socket housing segments 102. For example, the space 302 may be integrally formed with the socket housing segments 102 during an injection-molding process. In a further embodiment, the space 302 between the socket housing segments 102 may be created by removing material from a single housing structure to form the socket housing segments 102 with the space 302 between them. For example, the space 302 may be cut out of the one or more socket housing segments 102. In another embodiment, each of the socket housing segments 102 are formed separately and independently and the space 302 is formed by coupling the socket housing segments 102 together using the one or more alignment structures 108.

FIG. 4 depicts a further embodiment of a system 400 to align the socket housing segments 102 for the area array device 104. In the depicted embodiment, the system 400 includes the socket housing segments 102, the substrate 106, the bridging connections 108a, the frame structure 108b, and the group of socket contact posts 112.

In one embodiment, the system 500 is substantially similar to the system 300 depicted in FIG. 3, but with a frame structure 108b. In the depicted embodiment, the frame structure 108b fills the space 302 between the socket housing segments 102 and circumscribes the outer perimeter of the socket housing segments 102. The bridging connections 108a, in the depicted embodiment, fit over the frame structure 108b. In one embodiment, the frame structure 108b includes one or more openings that receive the bridging connections 108a. In one embodiment, the system 400 includes the frame structure 108b and does not include bridging connections 108a.

Figure 5:
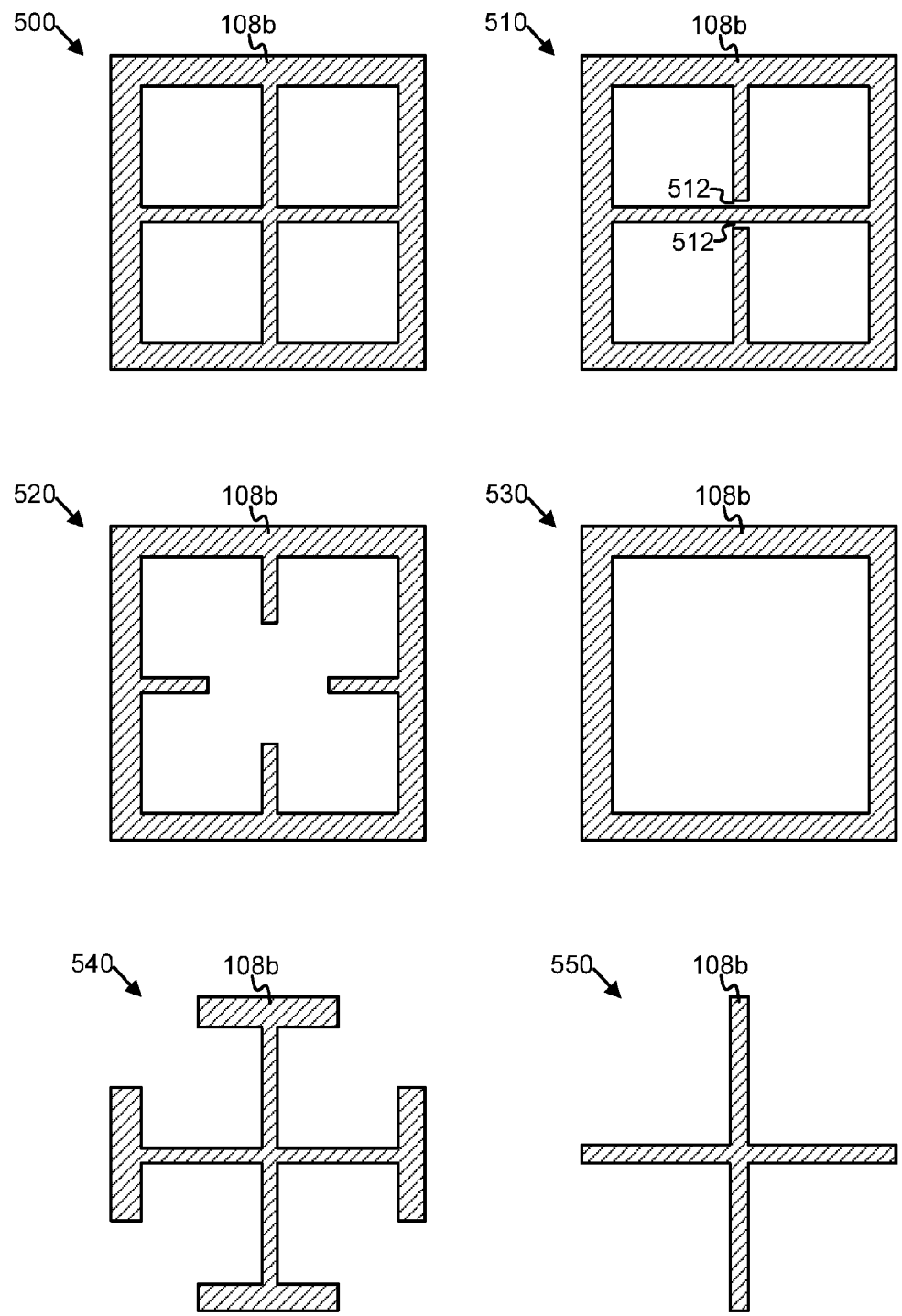
FIG. 5 is a schematic block diagram illustrating various embodiments of alignment structures in accordance with the present invention.

FIG. 5 depicts various embodiments 500, 510, 520, 530, 540, 550 of the frame structure 108b. In the first embodiment 500, the frame structure 108b is shaped to circumscribe each of the socket housing segments 102. In the second embodiment 510, the frame structure 108b includes one or more openings 512 to receive bridging connections 108a. The one or more openings 512, in one embodiment, allow bridging connections 108a to pass through the frame structure 108b without interfering with the frame structure 108b.

In the third embodiment 520, the frame structure 108b is shaped to partially fill the space 302 between the socket housing segments 102. The frame structure 108b, in one embodiment, ends at a point where a bridging connection 108a spans the space 302 between the socket housing segments 102. In the fourth embodiment 530, the frame structure 108b is shaped to circumscribe the outer perimeter of the socket housing segments 102 without passing through the space 302 between the socket housing segments 102.

In the fifth embodiment 540, the frame structure 108b is shaped to substantially fill the space 302 between the socket housing segments 102 and to partially circumscribe the outer perimeter of the socket housing segments 102. In the sixth embodiment 550, the frame structure 108b is shaped to substantially fill the space 302 between the socket housing segments 102 without circumscribing the outer perimeter of the socket housing segments 102.

In one embodiment, several frame structures 108b may be used together. For example, the frame structure 108b of the fourth embodiment 530 may circumscribe the outer perimeter of the socket housing segments 102 while the frame structure 108b of the sixth embodiment 550 fills the space 302 between the socket housing segments 102. In one embodiment, the frame structure 108b has a substantially similar height as the socket housing segments 102. In a further embodiment, the frame structure 108b has a different height than the socket housing segments 102. For example, in one embodiment, the frame structure 108b may be taller than the socket housing segments 102 and may receive the area array device 104. In another embodiment, for example, the frame structure 108b may be shorter than the socket housing segments 102 and may maintain the predefined alignment around a base of the socket housing segments 102 or the like. One of skill in the art, in view of this disclosure, will recognized other shapes and arrangements of frame structures 108b that may be used in embodiments of the present invention.

Figure 6:
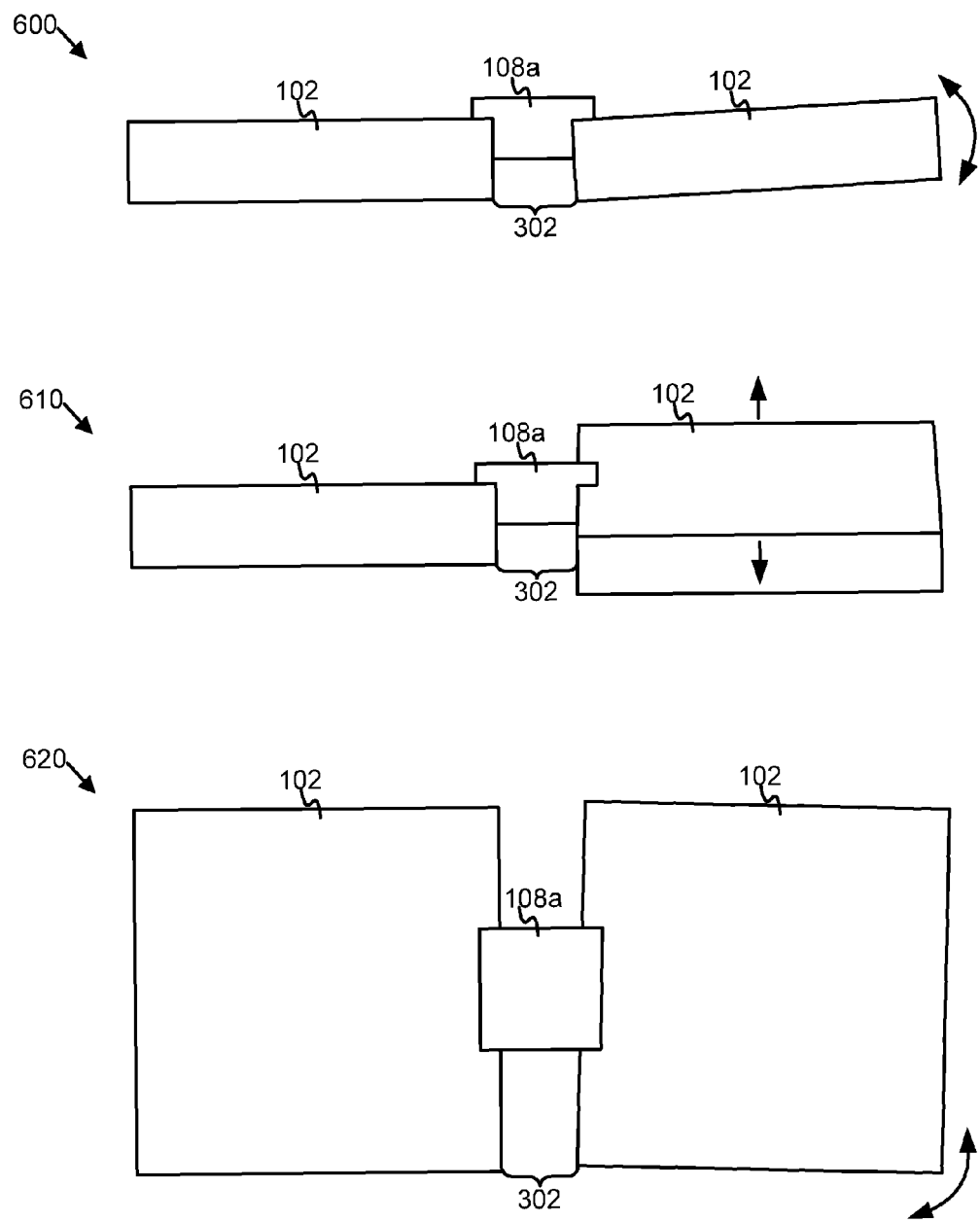
FIG. 6 is a schematic block diagram illustrating various embodiments of flexible movement between socket housing segments in accordance with the present invention.

FIG. 6 depicts various embodiments 600, 610, 620 of a bridging connection 108a allowing flexible movement between the socket housing segments 102. In one embodiment, the various embodiments 600, 610, 620 depict the same bridging connection 108a. In another embodiment, the various embodiments 600, 610, 620 depict different bridging connections 108a.

In each of the various depicted embodiments 600, 610, 620, the bridging connection 108a provides an axis of rotation for the socket housing segments 102. The bridging connection 108a, in the various embodiments 600, 610, 620, allows a predefined amount or degree of flexible movement of the socket housing segments 102 based on physical and mechanical properties of the bridging connections 108a.

In the first embodiment 600, the bridging connection 108a allows flexible movement of the socket housing segments 102 by allowing an amount of up and down rotation out of the plane of the socket housing segments 102. In one embodiment, the bridging connection 108a may allow an amount of up and down rotation to place the first side of a socket housing segment 102 substantially in parallel with the substrate 106 if the first side is somewhat crooked, and not fully in line with the second side of the socket housing segment 102 and/or the first side of another socket housing segment 102.

In the second embodiment 610, the bridging connection 108a allows flexible movement of the socket housing segments 102 by allowing side to side rotation out of the plane of the socket housing segments 102. As described with regard to the up and down rotation, the bridging connection 108a, in one embodiment, may use side to side rotation out of the plane of the socket housing segments 102 to place the first side of a socket housing segment 102 substantially in parallel with the substrate 106 if the first side is somewhat crooked, and not fully in line with the second side of the socket housing segment 102 and/or the first side of another socket housing segment 102.

In the third embodiment 620, the bridging connection 108a allows flexible movement of the socket housing segments 102 by allowing side to side rotation within the plane of the socket housing segments 102. The bridging connection 108a, in one embodiment, may allow an amount of side to side rotation within the plane of the socket housing segments 102 to align socket contact pads 110 on a socket housing segment 102 with substrate contact pads 116 when the socket contact pads 110 and/or the substrate contact pads 116 are misaligned or aligned slightly differently than socket contact pads 110 and/or substrate contact pads 116 corresponding to a different socket housing segment 102. One of skill in the art, in view of this disclosure, will recognize other embodiments and types of bridging connections 108a that are designed to provide other particular amounts and types of flexible movement suitable for use with the present invention.

Figure 7:
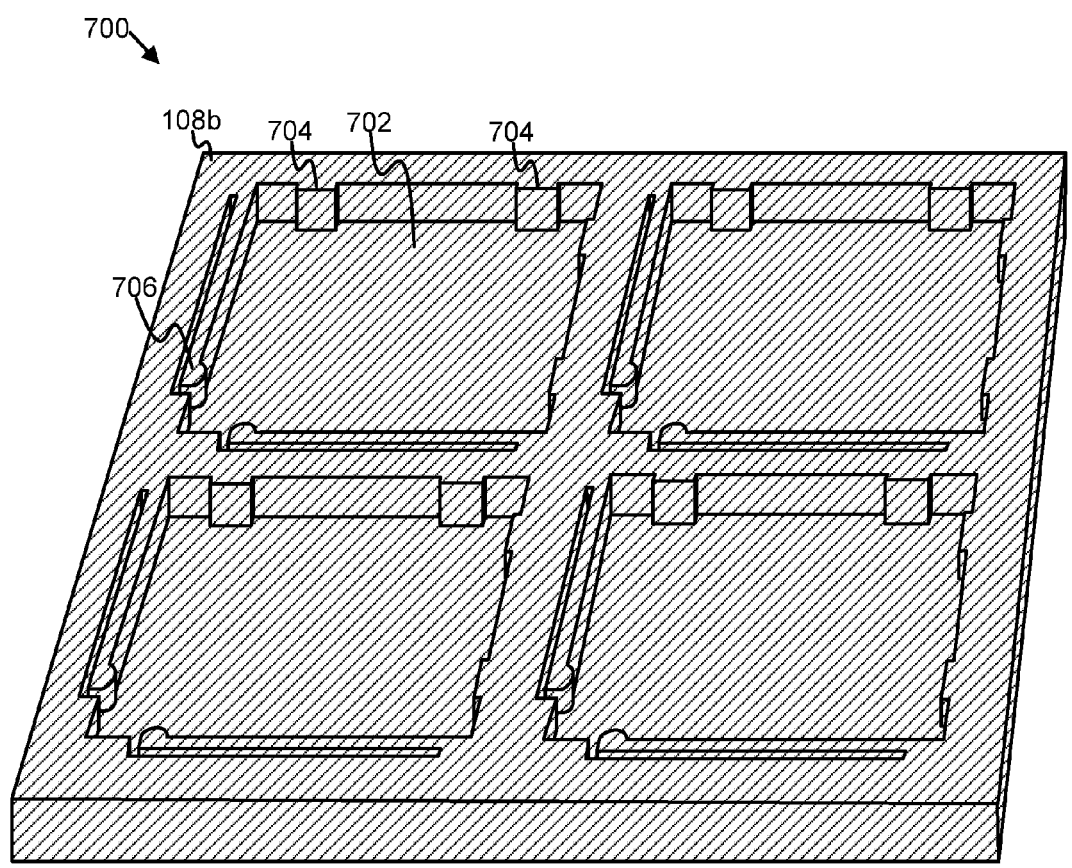
FIG. 7 is a schematic block diagram illustrating one embodiment of an alignment structure in accordance with the present invention.

FIG. 7 depicts one embodiment 700 of the frame structure 108b. In the depicted embodiment 700, the frame structure 108b includes several openings 702, several alignment keys 704, and several alignment springs 706. The frame structure 108b, in one embodiment, is removable from the socket housing segments 102.

In one embodiment, the openings 702 are shaped for removably receiving the socket housing segments 102. In the depicted embodiment, each opening 702 includes side walls around the perimeter of the opening 702 and a support wall across one side of the opening 702. In a further embodiment, the openings 702 do not include the support wall, or the support walls are partial walls with openings for the socket contact posts 112. In one embodiment, the openings 702 include the support walls and the openings 702 are large enough to fit the socket contact posts 112 within them. In a further embodiment, the socket contact posts 112 are attached to the socket housing segments 102 and electrically coupled to the socket contact pads 110 once the frame structure 108b has been removed from the socket housing segments 102.

In one embodiment, the alignment keys 704 align the socket housing segments 102 within the openings 702. The alignment keys 704, in one embodiment, interface with corresponding alignment recesses on the socket housing segments 102. In one embodiment, the alignment keys 704 prevent insertion of a socket housing segment 102 into an opening 702 with an improper orientation.

In one embodiment, the alignment springs 706 removable secure the socket housing segments 102 within the openings 702. In a further embodiment, the alignment springs 706 may assist with alignment of the socket housing segments 102 within the openings 702. The alignment springs 706, in one embodiment, place a spring force against the socket housing segments 102 so that the socket housing segments 102 remain in the openings 702 during the surface mount connection process. In one embodiment, the alignment springs 706 allow a pulling force of a predefined strength on one or more of the frame structure 108b, the socket housing segments 102, and/or the alignment springs 706 to remove the socket housing segments 102 from the openings 702.

Figure 8:
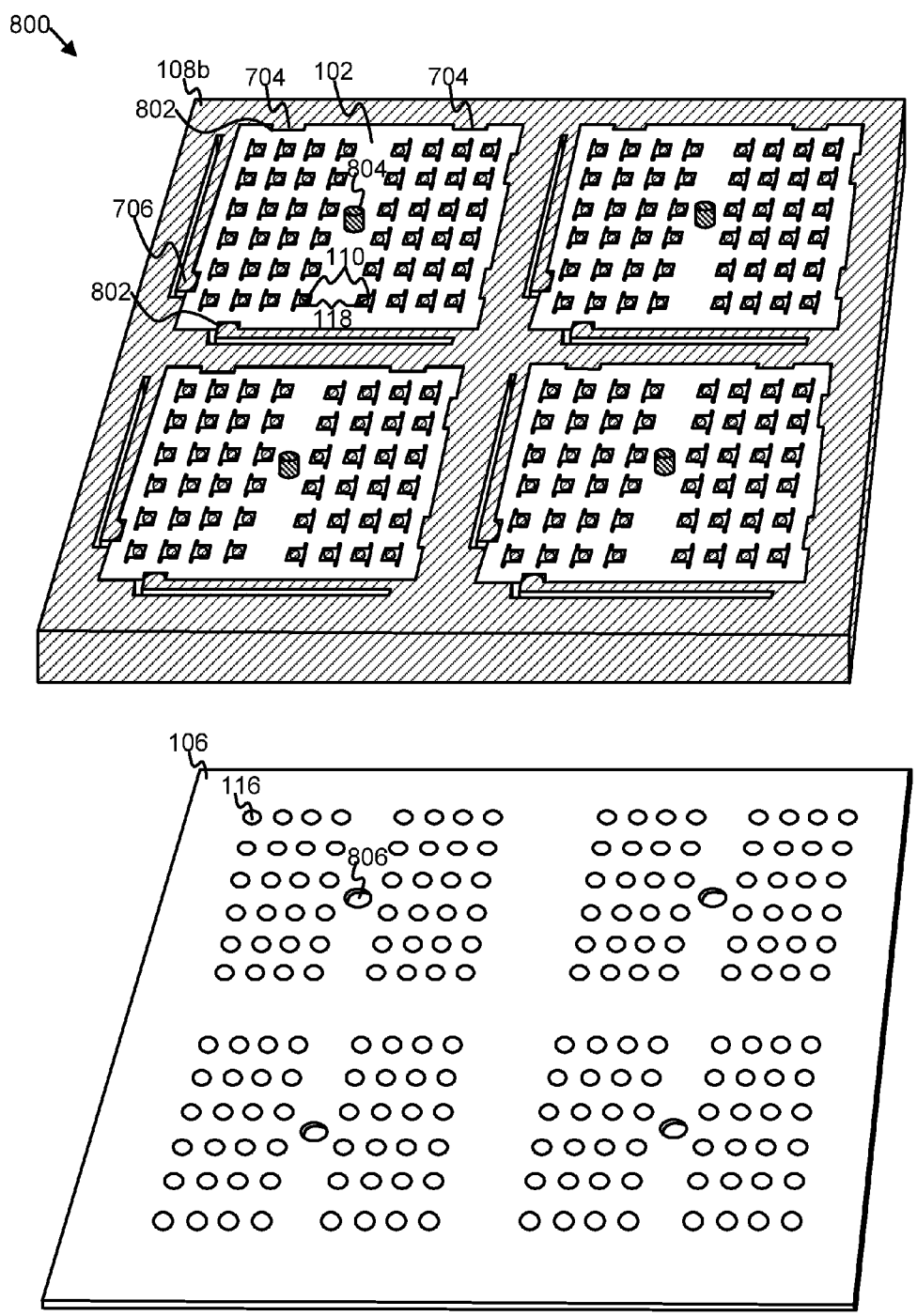
FIG. 8 is a schematic block diagram illustrating one embodiment of a system to align socket housing segments for an area array device in accordance with the present invention.

FIG. 8 depicts one embodiment of a system 800 to align the socket housing segments 102 for the area array device 104. In the depicted embodiment, the system 800 includes the substrate 106, the frame structure 108b, the openings 702, the alignment keys 704, and the alignment springs 706 and further includes several alignment recesses 802, several alignment pins 804, and several alignment holes 806.

In the depicted embodiment, the alignment recesses 802 correspond to the alignment keys 704. In one embodiment, the alignment recesses 802 receive the alignment keys 704 when a socket housing segment 102 is inserted with a correct orientation and prevent insertion of the socket housing segment 102 with an incorrect orientation. A correct orientation, in one embodiment, is an orientation of the socket housing segment 102 with the socket contact pads 110 facing and aligned with the substrate contact pads 116.

In the depicted embodiment, each of the socket housing segments 102 includes an alignment pin 804. In the depicted embodiment, the several alignment holes 806 correspond to the alignment pins 804. The alignment pins 804 and the alignment holes 806, in one embodiment, align the socket housing segments 102 and the socket contact pads 110 relative to the substrate 106 and the substrate contact pads 116.

In the depicted embodiment, the connecting material 118 includes solder balls initially disposed on each of the socket contact pads 110 to form a ball grid array. In one embodiment, a device assembler, such as one or more automated assembly devices, assembly workers, assembly tools, or the like, may flip the depicted frame structure 108b and place it on the substrate 106 such that the alignment pins 804 enter the alignment holes 806 and the connecting material 118 is between the socket contact pads 110 and the substrate contact pads 116. The frame structure 108b, in one embodiment, maintains a predetermined alignment of the socket contact pads 110 with the substrate contact pads 116 during a surface mount connection process, such as a solder reflow process. The device assembler, in one embodiment, may remove the frame structure 108b from the socket housing segments 102 in response to a completion of the surface mount connection process.

Figure 9:
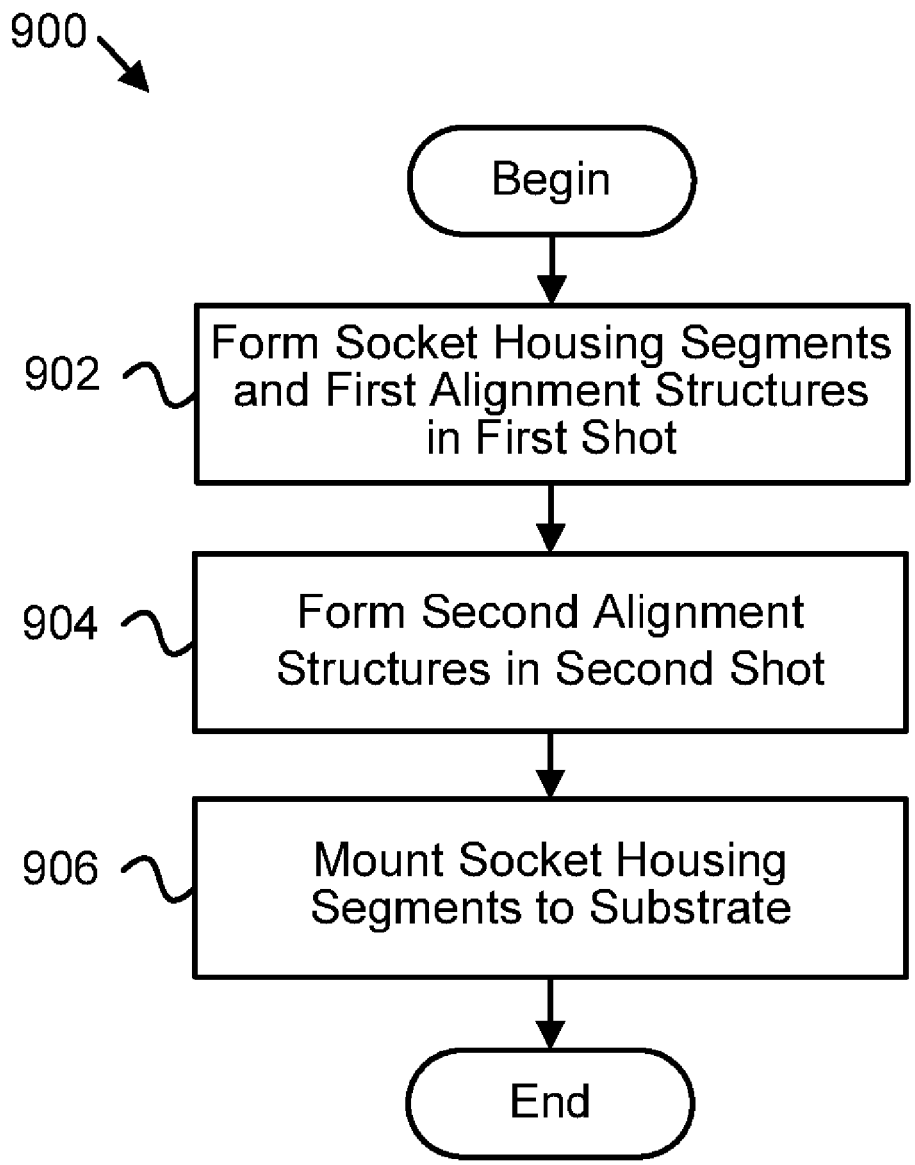
FIG. 9 is a schematic flow chart diagram illustrating one embodiment of a method for aligning socket housing segments for an area array device in accordance with the present invention.

FIG. 9 is a schematic flow chart diagram illustrating one embodiment of a method 900 for aligning the socket housing segments 102 for the area array device 104. In the depicted embodiment, the method 900 begins and a device assembler forms 902 the socket housing segments 102 and a first set of alignment structures 108 in a first shot of a multi-shot injection molding process. In one embodiment, the first set of alignment structures 108 includes the bridging connections 108a.

The device assembler, in one embodiment, may integrate the socket contact posts 112 and/or the socket contact pads 110 with the socket housing segments 102. For example, the device assembler may form the socket housing segments 102 around the socket contact posts 112 and/or the socket contact pads 110, insert the socket contact posts 112 and/or the socket contact pads 110 into the socket housing segments 102 using a staking or stitching process, or the like.

In the depicted embodiment, the device assembler forms 904 a second set of alignment structures 108 in a second shot of the multi-shot injection molding process. In one embodiment, the second set of alignment structures 108 includes the frame structure 108b. The device assembler, in one embodiment, forms 904 the second set of alignment structures 108 around the socket housing segments 102. The second set of alignment structures 108, in one embodiment, is formed of a different material than the first set of alignment structures 108. For example, the second set of alignment structures 108 may be formed of a material that substantially matches the coefficient of thermal expansion of the substrate 106.

The device assembler, in the depicted embodiment, mounts 906 the socket housing segments 102 to the substrate 106 during a surface mount connection process and the method 900 ends. In one embodiment, the surface mount connection process is a solder reflow process that melts the connecting material 118 to electrically and mechanically couple the socket contact pads 110 to the substrate contact pads 116. The device assembler may melt the connecting material 118 in a furnace, such as a belt furnace, a vacuum furnace, a box furnace, or the like, using conduction, convection, infrared, or other heating. In a further embodiment, the device assembler may mount 906 the socket housing segments 102 to the substrate 106 using a different surface mount connection process, such as an electrochemical plating process, a welding process, or another surface mount connection process that mechanically and electrically couples the socket contact pads 110 to the substrate contact pads 116. In a further embodiment, the connected socket housing segments 102 and substrate 106 may undergo further processing, such as quality checks for non-wet connections, flux cleaning, under-filling, connection to additional devices and/or components, and the like.

Embodiments of the present invention may be practiced in other specific forms. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "includes," "has," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. An apparatus to align socket housing segments for an area array device, the apparatus comprising:
   a plurality of socket housing segments for an area array device each socket housing segment comprising at least a first surface and a second surface, the second surface opposite the first surface, the second surface of each socket housing segment providing electrical connections for a portion of the area array device;
   a plurality of socket contact pads disposed on the first surfaces of the plurality of socket housing segments, the plurality of socket contact pads corresponding to substrate contact pads disposed on a substrate; and
   one or more alignment structures disposed at a space between the plurality of socket housing segments, each alignment structure coupled to at least two of the socket housing segments, the one or more alignment structures maintaining a predetermined alignment of each socket housing segment such that the plurality of socket contact pads aligns with the substrate contact pads during a surface mount connection process connecting the plurality of socket contact pads to the substrate contact pads.

2. The apparatus of claim 1, wherein the one or more alignment structures comprise one or more bridging connections, each bridging connection spanning the space between the plurality of socket housing segments to connect at least two socket housing segments from the plurality of socket housing segments.

3. The apparatus of claim 2, wherein each bridging connection allows flexible movement between the at least two socket housing segments to maintain the predetermined alignment.

4. The apparatus of claim 2, wherein the one or more alignment structures further comprise a frame structure disposed along one or more edges of the socket housing segments.

5. The apparatus of claim 4, wherein the frame structure substantially fills an area of the space between the plurality of socket housing segments not occupied by the one or more bridging connections.

6. The apparatus of claim 4, wherein the frame structure substantially circumscribes an outer perimeter of the plurality of socket housing segments.

7. The apparatus of claim 4, wherein the one or more bridging connections are formed of a same material as the plurality of socket housing segments in a shot of a multi-shot injection molding process and the frame structure is formed of a different material during a different shot of the multi-shot injection molding process.

8. The apparatus of claim 1, wherein the one or more alignment structures substantially fill the space between the plurality of socket housing segments.

9. The apparatus of claim 1, wherein the one or more alignment structures substantially circumscribe an outer perimeter of the plurality of socket housing segments.

10. The apparatus of claim 1, wherein at least one of the one or more alignment structures is removable from the plurality of socket housing segments such that the at least one alignment structure maintains the predetermined alignment during the surface mount connection process and the at least one alignment structure is removable upon completion of the surface mount connection process.

11. The apparatus of claim 1, further comprising a plurality of socket contact posts extending from the second surface of each of the plurality of socket housing segments, the plurality of socket contact posts corresponding to area array contact pads disposed on the area array device, the plurality of socket housing segments forming a hybrid land grid array ("LGA") socket.

12. The apparatus of claim 1, wherein at least one of the one or more alignment structures comprises a different material than the plurality of socket housing segments.

13. The apparatus of claim 12, wherein the different material has a coefficient of thermal expansion that substantially matches a coefficient of thermal expansion of the substrate.

14. The apparatus of claim 12, wherein the at least one alignment structure is formed in a different shot of a multi-shot injection molding process than the plurality of socket housing segments, the at least one alignment structure integrated with the plurality of socket housing segments during the multi-shot injection molding process.

15. The apparatus of claim 1, wherein the surface mount connection process comprises a reflow solder process soldering the plurality of socket contact pads to the substrate contact pads.

16. The apparatus of claim 1, further comprising the substrate and the area array device.

17. An apparatus to align socket housing segments for an area array device, the apparatus comprising:
a plurality of socket housing segments for an area array device each socket housing segment comprising at least a first surface and a second surface, the second surface opposite the first surface, the second surface of each socket housing segment providing electrical connections for a portion of the area array device;
a plurality of socket contact pads disposed on the first surfaces of the plurality of socket housing segments, the plurality of socket contact pads corresponding to substrate contact pads disposed on a substrate; and
one or more bridging connections disposed at a space between the plurality of socket housing segments, each bridging connection coupled to at least two of the socket housing segments, each bridging connection spanning the space between the plurality of socket housing segments to connect the at least two socket housing segments, the one or more bridging connections maintaining a predetermined alignment of each socket housing segment such that the plurality of socket contact pads aligns with the substrate contact pads during a surface mount connection process connecting the plurality of socket contact pads to the substrate contact pads.

18. The apparatus of claim 17, wherein each bridging connection allows flexible movement between the at least two socket housing segments to maintain the predetermined alignment.

19. The apparatus of claim 18, further
a frame structure disposed along one or more edges of the socket housing segments.

20. The apparatus of claim 19, wherein the one or more bridging connections are formed of a same material as the plurality of socket housing segments in a shot of a multi-shot injection molding process and the frame structure is formed of a different material during a different shot of the multi-shot injection molding process.

21. An apparatus to align socket housing segments for an area array device, the apparatus comprising:
a plurality of socket housing segments for an area array device each socket housing segment comprising at least a first surface and a second surface, the second surface opposite the first surface, the second surface of each socket housing segment providing electrical connections for a portion of the area array device;
a plurality of socket contact pads disposed on the first surfaces of the plurality of socket housing segments, the plurality of socket contact pads corresponding to substrate contact pads disposed on a substrate; and
a frame structure disposed at a space between the plurality of socket housing segments, the frame structure disposed along one or more edges of the socket housing segments, the frame structure coupled to at least two of the socket housing segments, the frame structure maintaining a predetermined alignment of each socket housing segment such that the plurality of socket contact pads aligns with the substrate contact pads during a surface mount connection process connecting the plurality of socket contact pads to the substrate contact pads.

22. The apparatus of claim 21, wherein the frame structure substantially fills the space between the plurality of socket housing segments.

23. The apparatus of claim 22, wherein the frame structure substantially circumscribe an outer perimeter of the plurality of socket housing segments.

24. The apparatus of claim 21, wherein the frame structure is removable from the plurality of socket housing segments such that the frame structure maintains the predetermined alignment during the surface mount connection process and the frame structure is removable upon completion of the surface mount connection process.

25. An apparatus to align socket housing segments for an area array device, the apparatus comprising:
- a plurality of socket housing segments for an area array device, each socket housing segment comprising at least a first surface and a second surface, the second surface opposite the first surface, the plurality of socket housing segments forming a hybrid land grid array ("LGA") socket;
- a plurality of socket contact pads disposed on the first surfaces of the plurality of socket housing segments, the plurality of socket contact pads corresponding to substrate contact pads disposed on a substrate;
- a plurality of socket contact posts extending from the second surface of each of the plurality of socket housing segments, the plurality of socket contact posts corresponding to area array contact pads disposed on the area array device;
- one or more bridging connections, each bridging connection spanning a space between the plurality of socket housing segments to connect at least two socket housing segments from the plurality of socket housing segments, the one or more bridging connections formed of a same material as the plurality of socket housing segments in a shot of a multi-shot injection molding process; and
- a frame structure disposed along one or more edges of the socket housing segments, the frame structure substantially filling an area of the space between the plurality of socket housing segments not occupied by the one or more bridging connections, the frame structure substantially circumscribing an outer perimeter of the plurality of socket housing segments, the frame structure formed of a different material than the plurality of socket housing segments during a different shot of the multi-shot injection molding process, the different material having a coefficient of thermal expansion that substantially matches a coefficient of thermal expansion of the substrate;
- wherein the one or more bridging connections and the frame structure are each coupled to at least two of the socket housing segments, the one or more bridging connections and the frame structure maintaining a predetermined alignment of each socket housing segment such that the plurality of socket contact pads aligns with the substrate contact pads during a reflow solder process soldering the plurality of socket contact pads to the substrate contact pads.

* * * * *